(12) United States Patent
Harward

(10) Patent No.: US 6,226,766 B1
(45) Date of Patent: May 1, 2001

(54) METHOD AND APPARATUS FOR BUILT-IN SELF-TEST OF SMART MEMORIES

(75) Inventor: Mark G. Harward, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 08/224,407

(22) Filed: Apr. 7, 1994

Related U.S. Application Data

(63) Continuation of application No. 07/946,502, filed on Sep. 17, 1992.

(51) Int. Cl.[7] .................................................. G11C 29/00
(52) U.S. Cl. ........................................... 714/719; 714/722
(58) Field of Search ................................. 371/21.1, 21.2, 371/21.5, 67.1, 68.1, 68.2, 29.1; 395/183.18, 182.03, 182.04, 183.16, 183.19, 183.2

(56) References Cited

U.S. PATENT DOCUMENTS

| | | | | |
|---|---|---|---|---|
| 4,715,034 | * | 12/1987 | Jacobson | 371/29.1 |
| 4,757,503 | * | 7/1988 | Hayes et al. | 371/21.1 |
| 4,899,313 | * | 2/1990 | Kumanoya et al. | 371/21.1 |
| 5,075,892 | * | 12/1991 | Choy | 371/21.2 |
| 5,109,382 | * | 4/1992 | Fukunaka | 371/21.1 |
| 5,200,963 | * | 4/1993 | Chau et al. | 371/68.1 |
| 5,231,605 | * | 7/1993 | Lee | 371/21.2 |
| 5,249,188 | * | 9/1993 | McDonald | 371/68.3 |
| 5,265,100 | * | 11/1993 | McClure | 371/68.1 |
| 5,274,648 | * | 12/1993 | Eikiel et al. | 371/21.2 |
| 5,311,520 | * | 5/1994 | Raghavachari | 371/21.2 |
| 5,400,342 | * | 3/1995 | Matsumura et al. | 371/21.2 |

OTHER PUBLICATIONS

Article by McCluskey, Edward J. entitled "Logic Design Principles" published by Prentice–Hall 1986. pp 458–459, 462–43, 468–471.

* cited by examiner

*Primary Examiner*—Christine T. Tu
(74) *Attorney, Agent, or Firm*—Robert L. Troike; Frederick J. Telecky, Jr.

(57) ABSTRACT

A self-testing smart memory (28) is provided in which memory test circuitry (46) within the smart memory (28) writes a pattern to a data RAM (32) and a broadcast RAM (34) and then reads the data RAM (32) and the broadcast RAM (34) to determine if any failures exist within the memory locations. Furthermore, a data path tester (50) determines the functionality of a data path (30) within smart memory (28).

20 Claims, 2 Drawing Sheets

METHOD AND APPARATUS FOR BUILT-IN SELF-TEST OF SMART MEMORIES

This application is a Continuation of application Ser. No. 07/946,502, filed Sep. 17, 1992.

TECHNICAL FIELD OF THE INVENTION

This invention relates generally to electronic circuits, and more particularly to a method and apparatus for built-in self-test of smart memories.

BACKGROUND OF THE INVENTION

Smart memories, or memories which appear externally as standard memory devices yet which contain on-chip processing capabilities, allow for implementation of massive parallel processing systems. As with all electronic circuits, however, the performance of such systems is dependent upon the reliability of each component within the system.

In parallel processing systems using smart memories, each of the smart memories forms an important component of the system that must operate reliably. Therefore, a need has arisen for a built-in self-test scheme for insuring the reliability of each smart memory. Furthermore, this built-in self-test scheme must operate quickly enough so as to not degrade the efficiency of the overall parallel processing system in which the smart memory resides.

SUMMARY OF THE INVENTION

In accordance with the teachings of the present invention, a self-testing smart memory is provided which substantially eliminates or reduces disadvantages and problems associated with prior smart memories. In particular, a smart memory is provided which includes a data RAM, a broadcast RAM, and a data path. Memory test circuitry within the smart memory is operable to write a pattern to the data RAM and the broadcast RAM and to compare the contents of the data RAM and the broadcast RAM with the pattern. Any failures in the RAM memory result in an indication that the smart memory failed the self-test. Furthermore, data path test circuitry within the smart memory is operable to test the functionality of the data path.

An important technical advantage of the present invention is the fact that a smart memory using the present invention can internally perform a self-test to determine its operability. Furthermore, this self-test, because it is performed internally, is performed quickly so as to maximize efficiency of a system using smart memories.

BRIEF DESCRIPTION OF THE DRAWINGS

For a more complete understanding of the present invention and the advantages thereof, reference is now made to the following description taken in conjunction with the accompanying drawings in which like reference numerals indicate like features and wherein.

DETAILED DESCRIPTION OF THE INVENTION

The preferred embodiments of the present invention are illustrated in FIGS. 1 through 6 of the drawings, like numerals being used to refer to like and corresponding parts of the various drawings.

Figure 1:
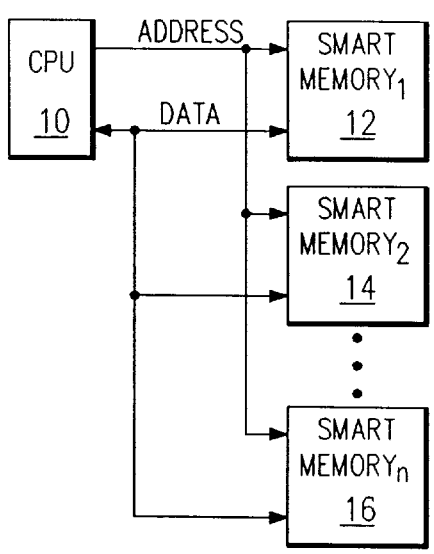
FIG. 1 is a block diagram of a parallel processing system employing smart memories.

FIG. 1 is a simplified block diagram of a parallel processing system incorporating smart memories. As shown in FIG. 1, CPU 10 is coupled to smart memories 12, 14, and 16 through address and data busses. Smart memories 12, 14, and 16 represent n smart memories arrayed to form a massive parallel processing system. Each of these smart memories may be smart memories according to U.S. patent application Ser. No. 07/498,235 filed Mar. 16, 1990, entitled "Distributed Processing Memory," and assigned to Texas Instruments Incorporated. That application is herein incorporated by reference.

Figure 2:
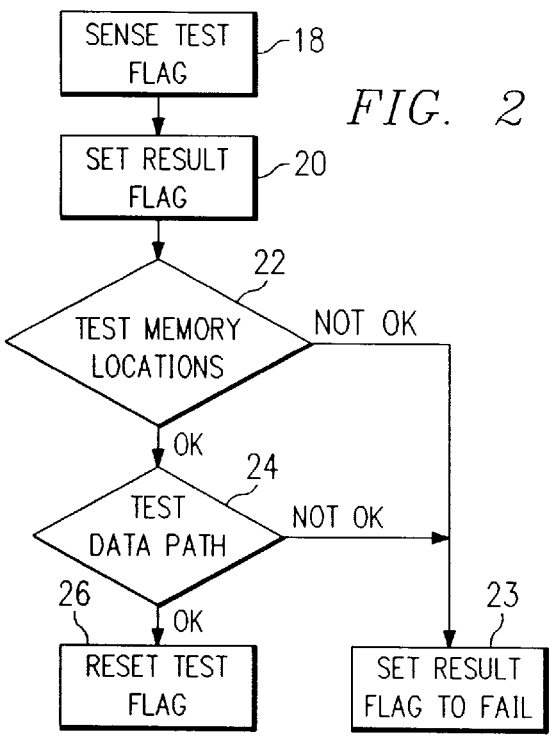
FIG. 2 is a flow chart of a built-in self-test scheme according to the teachings of the present invention.

FIG. 2 illustrates a flow diagram for a built-in self-test for a smart memory according to the present invention. As shown in FIG. 2, the built-in self-test circuitry first senses a test flag at block 18 to initiate the test sequence. The test flag is transmitted by CPU 10 as shown in FIG. 1. Other devices, such as dedicated timers, could also be used to generate the test flag. In a preferred embodiment, the test flag is a pattern transmitted across the address lines to a smart memory. With this embodiment, no extra pins are required to initiate the test sequence. In an alternate embodiment, a dedicated pin could be provided on the smart memory for test initiation. Upon activation of this dedicated test pin, the test sequence would be initiated.

Once the test flag has been sensed at block 18, a result flag is set at block 20. This result flag is set to the "pass" state, indicating that the chip has passed the self-test. If, later in the sequence, it is determined that the smart memory does not pass the self-test, then the result flag will be set to "fail". After the result flag has been set at block 20, the memory locations within the smart memory are tested at decision block 22. The details of this test will be discussed later. If any of the memory locations are not functioning properly, the result flag will be set to "fail" at block 23. If the memory locations are operating properly, then the test sequence continues to decision block 24. At decision block 24, the processing element(s), or data path portion of the smart memory is tested. If the data path is not functioning properly, as will be discussed in detail below, the result flag is set to "fail" at block 23. If the data path is operating properly, then the test flag will be reset at block 26 indicating the end of the test.

In a system incorporating smart memories with built-in self-test circuitry according to the present invention, a CPU or other controller could poll the result flag of each smart memory after completion of the self-test. For example, the CPU could be programmed to begin polling the result flag memory location of each smart memory after a predetermined number of clock cycles. This predetermined number would be equal to the number of clock cycles required for each smart memory to complete its self-test. As an alternate embodiment, each smart memory could send a signal to the host CPU or other controller indicating the results of the self-test. This information could be sent via interrupt signals, or via a dedicated line for indicating test result status after completion of the self-test.

Figure 3:
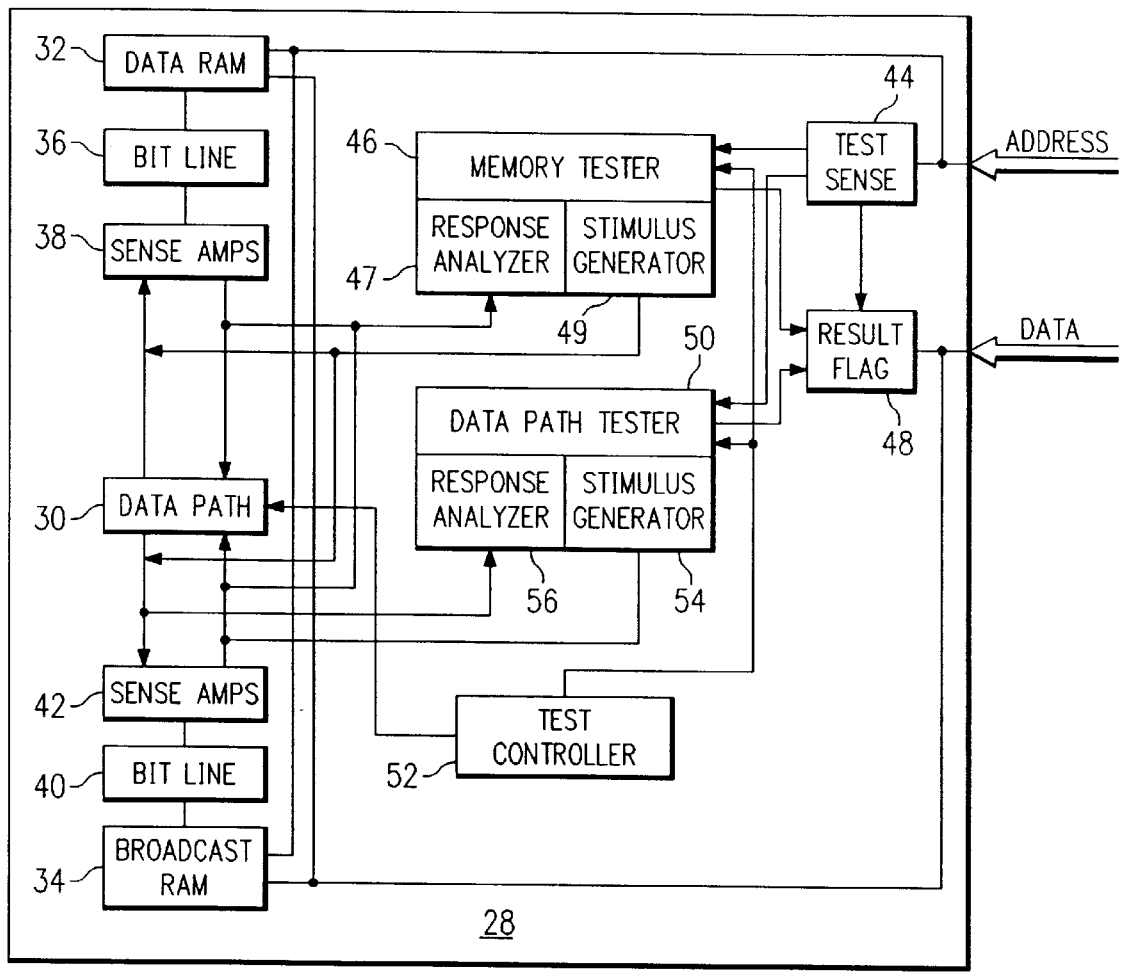
FIG. 3 is a block diagram of a smart memory including a built-in self-test circuit according to the teachings of the present invention.

FIG. 3 illustrates a block diagram of a smart memory 28 including a built-in self-test circuit according to the present invention. As shown in FIG. 3, smart memory 28 includes a data path 30. Data path 30 performs various processing functions, depending on the design of the smart memory 28. For example, data path 30 may be a matrix multiplier or a full blown processing core. Coupled to data path 30 are data RAM 32 and broadcast RAM 34. As discussed in U.S. patent application Ser. No. 07/498,235 the broadcast RAM is a RAM memory used for data that is common to other smart memories within a parallel processing system. Data RAM 32 is a memory storage accessible by data path 30 and by external devices accessing smart memory 28. Data RAM 32 is coupled to data path 30 through bit lines 36 and sense amps 38. Likewise, broadcast RAM 34 is coupled to data path 30 through bit lines 40 and sense amps 42.

Test sense circuitry 44, as shown in FIG. 3 is coupled to the address bus. Furthermore, test sense circuitry 44 is coupled to memory tester 46, result flag 48, and data path tester 50. Memory tester 46 is coupled to result flag 48. Memory tester 46 includes a response analyzer 47 and a stimulus generator 49. Response analyzer 47 and stimulus generator 49 are coupled to data RAM 32 and broadcast RAM 34. Data path tester 50 is coupled to result flag 48 and to data path 30. Furthermore, test controller 52 is coupled to data path tester 50, memory tester 46, and data path 30.

In operation, test sense circuitry 44 senses that a test flag has been sent to initiate a test sequence. Test sense circuitry 44 then sets result flag 48 to the "pass" state as shown in block 20 of FIG. 2. Next, memory tester 46 tests each of the memory locations within data RAM 32 and broadcast RAM 34. Memory tester 46 tests each of these memory locations by writing a fixed pattern generated by stimulus generator 49, such as all ones, all zeros, a pseudo random pattern, or a pattern expected to detect the most failures for all address locations to each memory location. Response analyzer 47 of memory tester 46 then reads each of these memory locations and compares them with the data that was written to each location. If there are any discrepancies, memory tester 46 sets result flag 48 to the "fail" state.

For example, common failure modes in RAMs are full row on column failures and single bit failures caused by "stuck-at" faults in which some circuit node is incorrectly held at a logic level "0" or "1" regardless of the desired state. These failures can frequently be detected by writing all "1"s, then reading, then writing "0"s and then reading the array. Another common pattern is to write a checkerboard of "1"s and "0"s to the array, and then read it back to compare stored value observations to the input pattern. This is then followed by the logical complement of the first checkerboard pattern. These are examples of non-pseudo-random test techniques which the memory test controller could be designed to execute.

After each of the memory locations is tested, data path tester 50 tests the functionality of data path 30. Several different processes may be used for testing the functionality of the data path, as will be discussed below. In general, however, data path tester 50 will send a pattern to data path 30. Because data path 30 performs certain processing functions, test controller 52 will control data path 30 to perform those processing functions on the pattern transmitted by data path tester 50. Once data path 30 has processed the pattern received by data path tester 50, data path 30 transmits the processed pattern back to data path tester 50. Data path tester 50 then analyzes the response to determine if data path 30 has processed the pattern as was expected. If data path 30 has not so processed the data, then result flag 48 is set to the "fail" state, indicating that data path 30 is not functioning properly. As shown in FIG. 3, the pattern that is sent to data path 30 by data path tester 50 is generated by stimulus generator 54 of data path tester 50. Furthermore, the processed data transmitted by data path 30 to data path tester 50 is received by response analyzer 56.

As shown in FIG. 3, memory tester 46 and data path tester 50 are separate. It should be understood that they could comprise the same circuitry. Likewise, focusing on the components of testers 46 and 50, it should be understood that stimulus generators 49 and 54 could comprise the same or separate circuitry, and response analyzers 47 and 56 could be the same or separate circuits.

Figure 4:
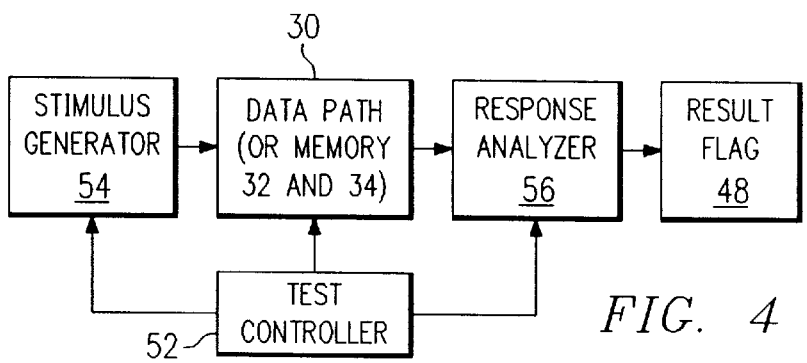
FIG. 4 is a block diagram of a built-in self-test circuit according to the teachings of the present invention.

FIG. 4 illustrates a general block diagram of the interconnection of stimulus generator 54, data path 30, response analyzer 56, test controller 52, and result flag 48. As shown in FIG. 4 stimulus generator 54 transmits its stimulus to data path 30. Data path 30 then processes the stimulus and transmits the processed result to response analyzer 56. Response analyzer 56 then sets result flag 48 if data path 30 has not processed the stimulus properly. Furthermore, test controller 52 controls stimulus generator 54 to generate the stimulus, controls data path 30 to receive and process the stimulus, and then controls response analyzer 56 to analyze the processed data from data path 30.

Within block 30 of FIG. 4, it is indicated that memory 32 and 34 could also be tested by stimulus generator 54 and response analyzer 56. This is to indicate that the same circuitry used to test data path 30 could be used to test data RAM 32 and broadcast RAM 34.

As discussed, test controller 52 controls the various elements involved in the self-test. Furthermore, test controller 52 may be used to load certain processing registers within data path 30. For example, if data path 30 is designed for matrix multiplication of data within data RAM 32 or broadcast RAM 34 with the data stored in an accumulator, test controller 52 may be used to load the accumulator with predetermined bits for purposes of testing the ability of data path 30 to multiply the accumulator with the stimulus generated by stimulus generator 54.

Figure 5:
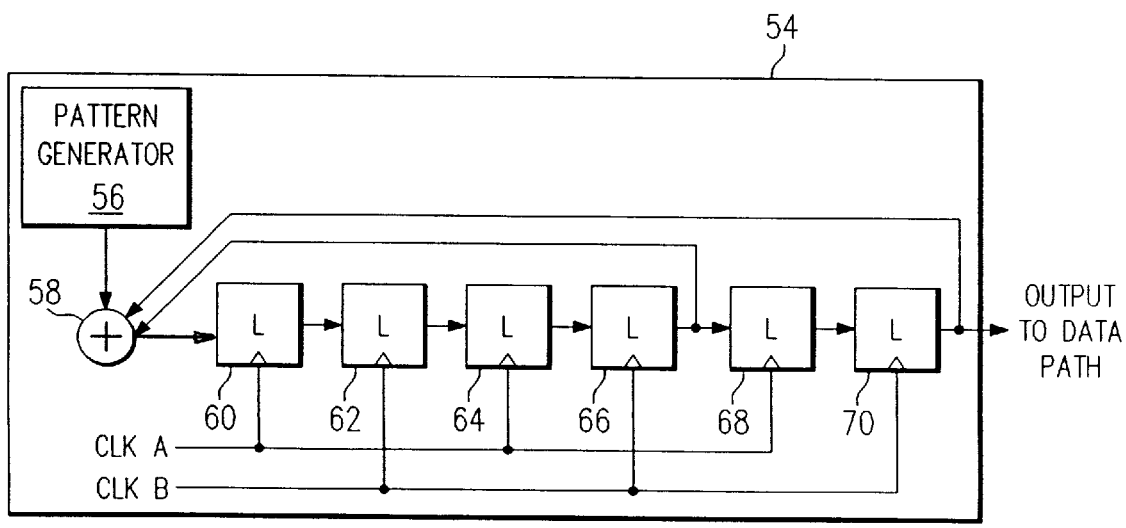
FIG. 5 is a block diagram of a stimulus generator constructed according to the teachings of the present invention.

FIG. 5 illustrates a particular embodiment of stimulus generator 54. In this embodiment, a linear feedback shift register is used to generate the stimulus to be output to data path 30. A pattern generator 56 generates a repeating sequence of bits. For example, pattern generator 56 may be a counter. Pattern generator 56 is input to an exclusive OR gate (XOR) 58. XOR 58 operates on the output of pattern generator 56 with signals fed back from varying points along the linear shift register outputting a logic level "1" if and only if only one of its inputs is a logical "1". The output of XOR 58 is input to a first stage, comprised of latches 60 and 62. Latch 60 is coupled to clock A and latch 62 is coupled to clock B. Clock A and clock B are non-overlapping clocks operating at the same frequency. These clocks may be derived from a system clock on board smart memory 28. See, for example, "Built-In Test for VLSI—Pseudorandom Techniques", Bardell, McAnney, Savin, John Wiley & Sons, 1987, pp. 61–68.

The output of latch 62 is input to a second stage, comprised of latches 64 and 66. Latch 64 is coupled to clock A and latch 66 is coupled to clock B. Finally, the output of latch 66 is input to a third stage, comprising latches 68 and 70. Latch 68 is coupled to clock A and latch 70 is coupled to clock B. The input to each stage is latched into the first latch of that stage on the edge of clock A. The signal is then output from the second latch of each stage on the edge of clock B. The outputs of latch 66 and latch 70 are fed back to XOR 58. With the linear feed-back shift register shown in FIG. 5, a pseudo-random pattern is generated by stimulus generator 54.

It should be recognized that the particular stimulus generator shown in FIG. 5 is for purposes of teaching the present invention, and other stimulus generators can be used without departing from the intended scope herein. The particular stimulus generator should be chosen to generate patterns that will catch a high percentage of error conditions within data path 30. Thus, depending on the complexity of data path 30, varying degrees of complexities should be chosen for stimulus generator 54. For example, for a complex data path 30, a linear feedback shift register (LFSR) with more than 3 stages may be chosen for stimulus generator 54. Preferably, a maximal length LFSR chosen for each application to ensure the highest percentage of error conditions are detected. Furthermore, stimulus generators with multiple, parallel outputs may be used to test data paths having multiple processing capabilities.

Response analyzer 56, as discussed above, analyzes the processed output of data path 30 after it has processed the pattern input by stimulus generator 54. Thus, response analyzer 56 compares the processed output of data path 30 with an expected output. If this comparison reveals an error in the processing of data path 30, then the result flag 48 will be set to the "fail" state.

Response analyzer 56 may comprise various response analyzer circuits generally known in the art. For example, response analyzer 56 may comprise circuitry for performing parity checking, transition counting, ones counting, signature analysis, or Walsh spectra analysis. In each of these examples, the output from data path 30 is analyzed by response analyzer 56 to detect errors in the functionality of data path 30.

Figure 6:
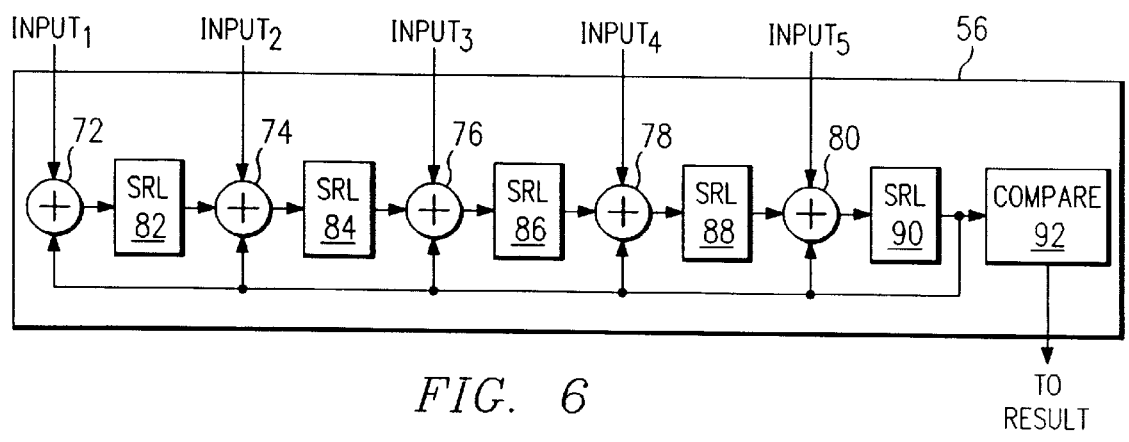
FIG. 6 is a block diagram of a response analyzer constructed according to the teachings of the present invention.

FIG. 6 illustrates a particular embodiment of response analyzer 56 implemented with a multiple input shift register for signature analysis. Signature analysis reduces the data output from the test greatly. One technique is to use an LFSR to perform Galois division at the test output bit stream. The signature is the remainder in this scheme. When the device under test (DUT) has multiple outputs such as the data path or the memory arrays, it is possible to perform parallel signature analysis using multiple input shift registers (MISR).

If there are more DUT outputs than are feasible to test in parallel due to the required length of the MISR causing excessive chip area penalty, one can couple the DUT to the MISR through a multiplexer (MUX). The MUX would be controlled by the test control logic. Alternatively or additionally, it should be noted that more than one LFSR or MISR can be employed to test multiple output DUTs. See, for example, "Digital Test Principles", ITC Tutorial Notes, Nashville, 1991.

With a multiple input shift register as shown in FIG. 6, data paths with multiple processing capabilities can be analyzed in parallel. The example shown in FIG. 6 illustrates a data path 30 with five processing elements. The outputs from each of these processing elements are input to response analyzer 56 as $Input_1$, $Input_2$, $Input_3$, $Input_4$, and $Input_5$. These inputs are input to XORs 72, 74, 76, 78, and 80, respectively. The output of XOR 72 is input to shift register latch 82. The output of shift register latch 82 is input to XOR 74. The output of XOR 74 is input to shift register latch 84. The output of shift register latch 84 is coupled to the input of XOR 76. The output of XOR 76 is coupled to shift register latch 86. The output of shift register latch 86 is coupled to the input of XOR 78. The output of XOR 78 is coupled to the input of shift register latch 88. The output of shift register latch 88 is coupled to the input of XOR 80. The output of XOR 80 is coupled to the input of shift register latch 90. The output of shift register latch 90 is coupled to the input of compare circuit 92. Furthermore, the output of shift register latch 90 is input to XOR 78, XOR 74, and XOR 72.

The multiple input shift register shown in FIG. 6 compresses the output from a complex data path and allows for parallel signature testing. See, for example, "Built-In Test for VLSI—Pseudorandom Techniques", Bardell, McAnney, Savin, John Wiley & Sons, 1987, pp. 61–68. The output of shift register latch 90 is the output of the multiple input shift register and is coupled to compare circuit 92. Compare circuit 92 compares the output of shift register latch 90 with an expected output to determine the functionality of data path 30. If there is a discrepancy in the expected output from the actual output, result flag 48 will be set in the "fail" state.

As another example for response analyzer 56 shown in FIG. 4, response analyzer 56 could be a simple NOR Gate for certain applications. For example, if the data path 30 is designed for matrix multiplication of memory with an accumulator, the accumulator could be loaded with logical zeroes and stimulus generator 54 could input all logical ones to data path 30. Since the multiplication of accumulator with these logical ones should result in logical zeroes, the response analyzer 56 would NOR each processed bit from data path 30 with a logical zero such as $V_{ss}$. If any result bit from response analyzer 56 is a logical zero, the fail flag will be set, since all of the result bits should be logical ones.

Although the present invention has been described in detail, it should be understood that the various changes, substitutions and alterations can be made without departing from the spirit and scope of the invention as defined solely by the appended claims.

What is claimed is:

1. A self-testing smart memory, comprising:
    a data RAM, said data RAM for storing data accessible by other smart memories;
    a data path, connected to said data RAM, wherein said data path includes a plurality of processing elements operable to perform specific functions;
    a broadcast RAM connected to said data path, said broadcast RAM for storing data accessible by said data path and by external devices accessing the smart memory;
    memory test circuitry, coupled to said broadcast RAM and said data RAM, for testing said broadcast RAM and said data RAM, wherein said testing includes: writing a pattern to said data RAM and said broadcast RAM and comparing the contents of said data RAM and said broadcast RAM with said pattern;
    data path test circuitry, coupled to said data path, for testing said specific functions of said plurality of processing elements of said data path, wherein said testing includes: writing another pattern to said data path and comparing a response from said data path with an expected result; and
    a test controller, coupled to said data path test circuitry and said data path, for controlling said data path to perform said specific functions on said another pattern.

2. The smart memory of claim 1, wherein said memory test circuitry and said data path test circuitry perform said testing in response to a test instruction received by said smart memory.

3. The smart memory of claim 1, wherein said memory test circuitry and said data path test circuitry set a result flag upon completion of testing.

4. The smart memory of claim 1, wherein said data path test circuitry comprises:

a stimulus generator for generating and transmitting a pattern to said data path, said data path processing said pattern into a processed output; and a response analyzer, coupled to said data path, for comparing the processed output with an expected output to test the functionality of said data path; and a controller, coupled to said stimulus generator and said response analyzer, for controlling said stimulus generator and said response analyzer during testing of said data path.

5. The smart memory of claim 4, wherein said stimulus generator comprises a linear feedback shift register for generating and transmitting a pseudo-random pattern to said data path.

6. The smart memory of claim 4, wherein said response analyzer comprises circuitry for checking the parity of the processed output to test the functionality of said data path.

7. The smart memory of claim 4, wherein said response analyzer comprises circuitry for counting transitions of the processed output to test the functionality of said data path.

8. The smart memory of claim 4, wherein said response analyzer comprises circuitry for counting ones in the processed output to test the functionality of said data path.

9. The smart memory of claim 4, wherein said response analyzer comprises circuitry for performing signature analysis on the processed output to test the functionality of said data path.

10. The smart memory of claim 9, wherein said response analyzer comprises:

a multiple input shift register for compressing said processed output to generate a compressed output; and compare circuitry for comparing said compressed output with a data path signature.

11. The smart memory of claim 4, wherein said response analyzer comprises circuitry for performing a Walsh spectra analysis on the processed output to test the functionality of said data path.

12. A method of self-testing a smart memory including a data RAM, a broadcast RAM, and a data path which includes a plurality of processing elements operable to perform specific functions, comprising the steps of:

writing a pattern to the data RAM and the broadcast RAM;

comparing the contents of the data RAM with the pattern using memory test circuitry; and comparing the contents of the broadcast RAM with the pattern using said memory test circuitry;

writing another pattern to the data path;

testing said specific functions of said plurality of processing elements of the data path with data path test circuitry in accordance with results of said comparing steps using said another pattern; and controlling said data path to perform said specific functions during said testing step.

13. The method of claim 12, and further comprising the step of initiating self-testing in response to a test instruction received by the smart memory.

14. The method of claim 12, and wherein said comparing steps further include the step of setting a result flag.

15. The smart memory of claim 12, wherein said step of testing the functionality of the data path comprises:

transmitting a pattern from a stimulus generator to the data path for processing by the data path to yield a processed output;

comparing the processed output with an expected output in a response analyzer to test the functionality of the data path; and controlling the stimulus generator, data path, and response analyzer during testing of the data path.

16. The method of claim 15, wherein said step of comparing comprises checking the parity of the processed output to test the functionality of the data path.

17. The method of claim 15, wherein said step of comparing comprises counting transitions of the processed output to test the functionality of the data path.

18. The method of claim 15, wherein said step of comparing comprises counting ones in the processed output to test the functionality of the data path.

19. The method of claim 15, wherein said step of comparing comprises performing signature analysis on the processed output to test the functionality of the data path.

20. The method of claim 15, wherein said step of comparing comprises performing a Walsh spectra analysis on the processed output to test the functionality of the data path.

* * * * *